(12) United States Patent
Chang et al.

(10) Patent No.: US 10,241,538 B2
(45) Date of Patent: Mar. 26, 2019

(54) RESYNCHRONIZATION OF A CLOCK ASSOCIATED WITH EACH DATA BIT IN A DOUBLE DATA RATE MEMORY SYSTEM

(71) Applicant: Integrated Device Technology, Inc., San Jose, CA (US)

(72) Inventors: David Chang, Santa Clara, CA (US); Xudong Shi, San Jose, CA (US); Shubing Zhai, San Jose, CA (US); Chenxiao Ren, Fremont, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 56 days.

(21) Appl. No.: 15/439,190

(22) Filed: Feb. 22, 2017

(65) Prior Publication Data

US 2018/0239391 A1  Aug. 23, 2018

(51) Int. Cl.

| G06F 1/12 | (2006.01) |
| G06F 1/10 | (2006.01) |
| G11C 7/10 | (2006.01) |
| G11C 5/02 | (2006.01) |
| G11C 5/06 | (2006.01) |
| G11C 7/22 | (2006.01) |
| G06F 13/16 | (2006.01) |

(52) U.S. Cl.
CPC .............. *G06F 1/10* (2013.01); *G11C 5/025* (2013.01); *G11C 5/063* (2013.01); *G11C 7/1066* (2013.01); *G11C 7/1093* (2013.01); *G11C 7/222* (2013.01); *G06F 13/1689* (2013.01)

(58) Field of Classification Search
USPC ......................................................... 713/401
See application file for complete search history.

(56) References Cited

U.S. PATENT DOCUMENTS

| 4,965,814 A | * | 10/1990 | Yoshida | ................ | H04J 3/0608 |
| | | | | | 327/41 |
| 5,259,006 A | * | 11/1993 | Price | ......................... | G06F 1/10 |
| | | | | | 327/141 |
| 6,172,964 B1 | * | 1/2001 | Whitton | ..................... | G06F 5/06 |
| | | | | | 370/230 |
| 6,556,505 B1 | * | 4/2003 | Tojima | ....................... | G06F 1/10 |
| | | | | | 365/194 |

(Continued)

*Primary Examiner* — Jaweed A Abbaszadeh
*Assistant Examiner* — Volvick Derose
(74) *Attorney, Agent, or Firm* — Christopher P. Maiorana, PC

(57) ABSTRACT

An apparatus comprising an input interface, an output interface and an adjustment circuit. The input interface may comprise a plurality of input stages each configured to receive a data signal and a clock signal and present an intermediate signal. The output interface may comprise a plurality of output stages each configured to receive the intermediate signal, receive an adjusted clock signal and present an output signal. The adjustment circuit may comprise a plurality of adjustment components each configured to (i) receive the clock signal and (ii) present the adjusted clock signal. The clock signal may be presented through a clock tree. The adjustment circuit may be located near the output interface. The adjustment circuit may be configured to resynchronize the clock signal for each bit transmitted to reduce a mismatch between a bit to bit delay and a delay caused by the clock tree.

18 Claims, 7 Drawing Sheets

(56) References Cited

U.S. PATENT DOCUMENTS

| | | | | |
|---|---|---|---|---|
| 7,571,337 B1* | 8/2009 | Zhai | ............... | G11C 27/02 |
| | | | | 375/376 |
| 7,894,278 B2* | 2/2011 | Lee | ............... | G11C 7/1078 |
| | | | | 365/189.05 |
| 9,627,012 B1* | 4/2017 | Huott | ............... | G11C 19/28 |
| 2001/0020278 A1* | 9/2001 | Saito | ............... | G06F 13/423 |
| | | | | 713/400 |
| 2003/0197537 A1* | 10/2003 | Saint-Laurent | ......... | G06F 1/10 |
| | | | | 327/165 |
| 2004/0125902 A1* | 7/2004 | Nishimura | ............ | H03K 5/082 |
| | | | | 375/371 |
| 2005/0190874 A1* | 9/2005 | Poskatcheev | ...... | G01R 31/3016 |
| | | | | 375/355 |
| 2012/0061764 A1* | 3/2012 | Lum | ............... | H05K 999/00 |
| | | | | 257/368 |
| 2014/0281654 A1* | 9/2014 | Holford | ............ | G06F 1/04 |
| | | | | 713/400 |
| 2016/0301518 A1* | 10/2016 | Ahn | ............... | G11C 7/10 |
| 2017/0134037 A1* | 5/2017 | Lye | ............... | H03M 1/662 |

* cited by examiner

RESYNCHRONIZATION OF A CLOCK ASSOCIATED WITH EACH DATA BIT IN A DOUBLE DATA RATE MEMORY SYSTEM

FIELD OF THE INVENTION

The invention relates to synchronous serial communication generally and, more particularly, to a method and/or apparatus for implementing resynchronization of a clock associated with each data bit in a double data rate (DDR) memory system.

BACKGROUND

In DDR4, DDR5 and other serdes data communication implementations, a source synchronization input clock and data are received and transmitted through input/output pads. There can be multiple data bits and a single clock path. A clock tree is implemented to provide the input clock to various components. A large clock tree can result in a mismatch between data transmission and the clock path. Chip design needs to balance the clock and data skew to meet a skew specification.

The skew balance becomes challenging and meeting the skew specification can be difficult in a high data rate transmission due to the data bit and clock mismatch. The process variation of the chips can cause a delay mismatch between the data bits. The layout, IR drop, the clock tree and driver mismatch contribute to the mismatch between each of the data bits and the clock path. Through the data path, more skew accumulates due to the delay variation and mismatch.

Conventional approaches tune and trim the delay for each data bit through register programming. Tuning and trimming the delay for each bit can keep the skew within the skew specification margin. Tuning and trimming becomes more challenging as design moves to DDR5, which has a higher data transfer rate. Tuning and trimming causes extra effort for the bench and automated test equipment (ATE) validation.

It would be desirable to implement resynchronization of a clock associated with each data bit in a double data rate (DDR) memory system.

SUMMARY

The invention concerns an apparatus comprising an input interface, an output interface and an adjustment circuit. The input interface may comprise a plurality of input stages each configured to (i) receive a data signal and a clock signal and (ii) present an intermediate signal. The output interface may comprise a plurality of output stages each configured to receive the intermediate signal from one of the input stages, (ii) receive an adjusted clock signal and (iii) present an output signal. The adjustment circuit may comprise a plurality of adjustment components each configured to (i) receive the clock signal and (ii) present the adjusted clock signal to each of the output stages. The clock signal may be presented through a clock tree. The adjustment circuit may be located near the output interface. The adjustment circuit may be configured to resynchronize the clock signal for each bit transmitted from the input interface to the output interface to reduce a mismatch between a bit to bit delay and a delay caused by the clock tree.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing resynchronization of a clock associated with each data bit in a double data rate (DDR) memory system that may (i) implement a phase-locked loop (PLL) near an output stage, (ii) implement a delay-locked loop (DLL) near an output stage, (iii) implement a phase adjustment circuit near an output stage, (iv) reduce a clock mismatch caused by a clock tree, (v) meet a skew specification at a high data rate, (vi) implemented in a register clock driver (RCD), (vii) implemented in a data buffer (DB) and/or (viii) be implemented as one or more integrated circuits.

Figure 1:
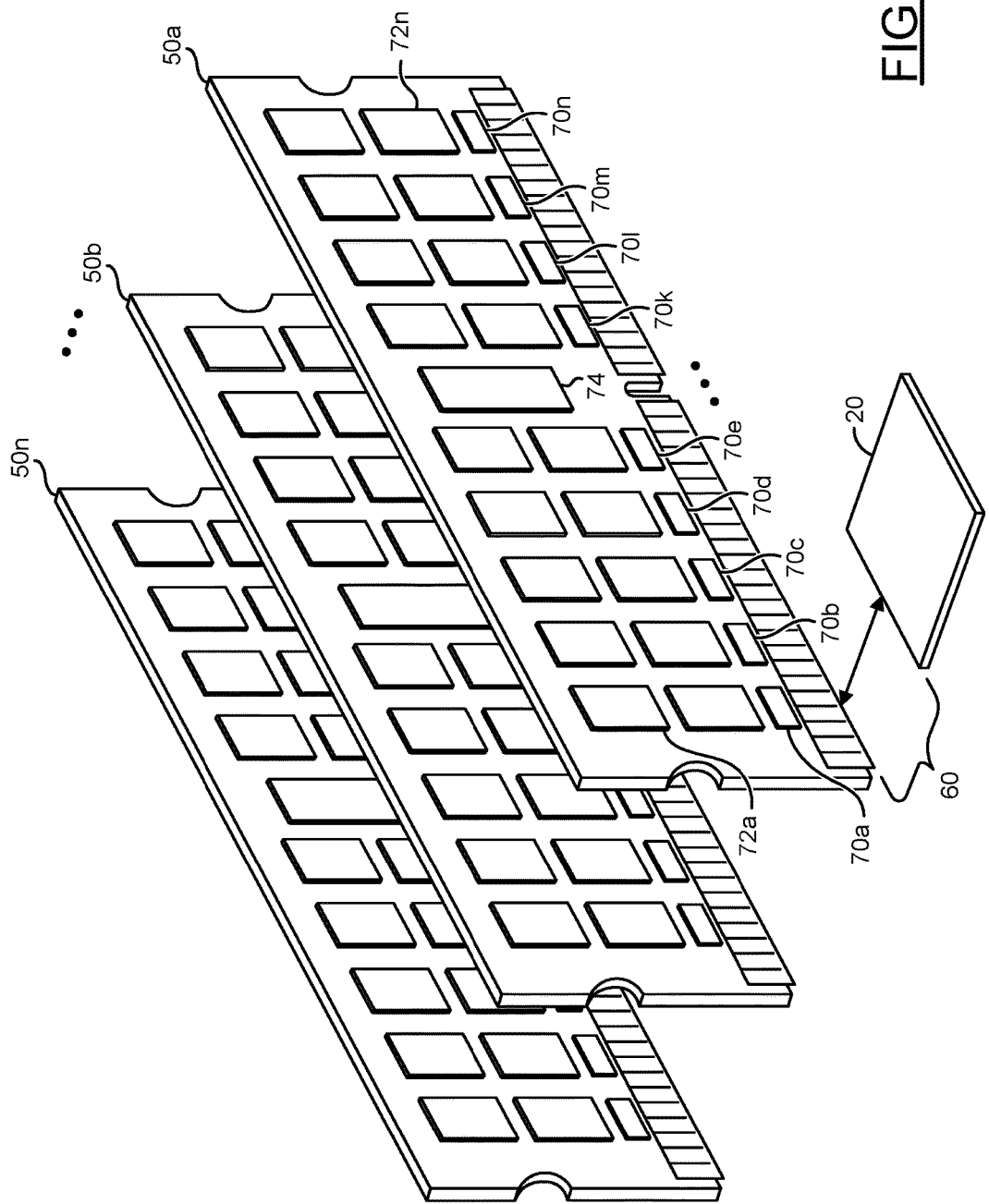
FIG. 1 is a diagram illustrating an example embodiment of a memory system.

Referring to FIG. 1, a diagram of a memory system is shown in accordance with an example embodiment of the invention. In various embodiments, the memory system includes a number of circuits 50a-50n. The circuits 50a-50n may be implemented as memory modules (or boards). In an example, the circuits 50a-50n may be implemented as dual in-line memory modules (DIMMs). In some embodiments, the circuits 50a-50n may be implemented as double data rate fourth generation (DDR4) synchronous dynamic random-access memory (SDRAM) modules. In some embodiments, the circuits 50a-50n may be implemented as double data rate fifth generation (DDR5) SDRAM modules.

In various embodiments, the circuits 50a-50n may comprise a number of blocks (or circuits) 70a-70n, a number of blocks (or circuits) 72a-72n, a block (or circuit) 74 and/or various other blocks, circuits, pins, connectors and/or traces. The circuits 70a-70n may be configured as data buffers. The circuits 72a-72n may implement memory devices. In an example, the circuits 72a-72n may be implemented as synchronous dynamic random-access memory (SDRAM) devices (or chips, or modules). The circuit 74 may be implemented as a registered clock driver (RCD). In an example, the RCD circuit 74 may be implemented as a DDR4 RCD circuit. In another example, the RCD circuit 74 may be implemented as a DDR5 RCD circuit. The type, arrangement and/or number of components of the memory modules 50a-50n may be varied to meet the design criteria of a particular implementation.

The memory modules 50a-50n are shown connected to a block (or circuit) 20. The circuit 20 may implement a memory controller. The circuit 20 may be located in another device, such as a computing engine. Various connectors/pins/traces 60 may be implemented to connect the memory modules 50a-50n to the memory controller 20. In some embodiments, the connectors/pins/traces 60 may be a 288-pin configuration. In an example, the memory controller 20 may be a component of a computer motherboard (or main board). In another example, the memory controller 20 may be a component of a microprocessor. In yet another example, the memory controller 20 may be a component of a central processing unit (CPU).

In an example, some of the connectors/pins/traces 60 may be part of the memory modules 50a-50n and some of the connectors/pins/traces 60 may be part of the motherboard and/or memory controller 20. The memory modules 50a-50n may be connected to the computer motherboard (e.g., by pins, traces and/or connectors 60) to transfer data between components of a computing device and the memory modules 50a-50n. In an example, the memory controller 20 may be implemented on a northbridge of the motherboard and/or as a component of a microprocessor (e.g., an Intel CPU, an AMD CPU, an ARM CPU, etc.). The implementation of the memory controller 20 may be varied according to the design criteria of a particular implementation.

In various embodiments, the circuits 50a-50n may be implemented as DDR4 (or DDR5) SDRAM memory modules. In an example, the circuits 50a-50n may have a memory module density of 512 gigabyte (GB), one terabyte (TB), or higher per module (e.g., compared to 128 GB per dual in-line memory module (DIMM) in DDR3). In embodiments implementing DDR4 SDRAM memory modules, the circuits 50a-50n may operate at voltages of 1.2-1.4 volts (V) with a frequency between 800-4266 megahertz (MHZ) (e.g., compared to 1.5-1.65V at frequencies between 400-1067 MHZ in DDR3). In some embodiments, the circuits 50a-50n may be implemented as low voltage DDR4 memory modules and operate at 1.05V. For example, in embodiments implementing low voltage DDR4 SDRAM memory modules, the circuits 50a-50n may implement 35% power savings compared to DDR3 memory. In embodiments implementing DDR4 SDRAM memory modules, the circuits 50a-50n may transfer data at speeds of 2.13-4.26 gigatransfers per second (GT/s) and higher (e.g., compared to 0.8-2.13 GT/s in DDR3). The operating parameters of the memory modules 50a-50n may be varied according to the design criteria of a particular implementation.

In an example, the memory modules 50a-50n may be compliant with the DDR4 specification entitled "DDR4 SDRAM", specification JESD79-4A, November 2013, published by the Joint Electron Device Engineering Council (JEDEC) Solid State Technology Association, Arlington, Va. Appropriate sections of the DDR4 specification are hereby incorporated by reference in their entirety.

The memory modules 50a-50n may be implemented as DDR4 load reduced DIMM (LRDIMM). The data buffers 70a-70n may allow the memory modules 50a-50n to operate at higher bandwidth and/or at higher capacities compared to DDR4 RDIMM (e.g., 2400 or 2666 MT/s for DDR4 LRDIMM compared to 2133 or 2400 MT/s for DDR4 RDIMM at 384 GB capacity). For example, compared to DDR4 RDIMM configurations, the DDR4 LRDIMM configuration of the memory modules 50a-50n may allow improved signal integrity on data signals and/or better intelligence and/or post-buffer awareness by the memory controller 20.

Figure 2:
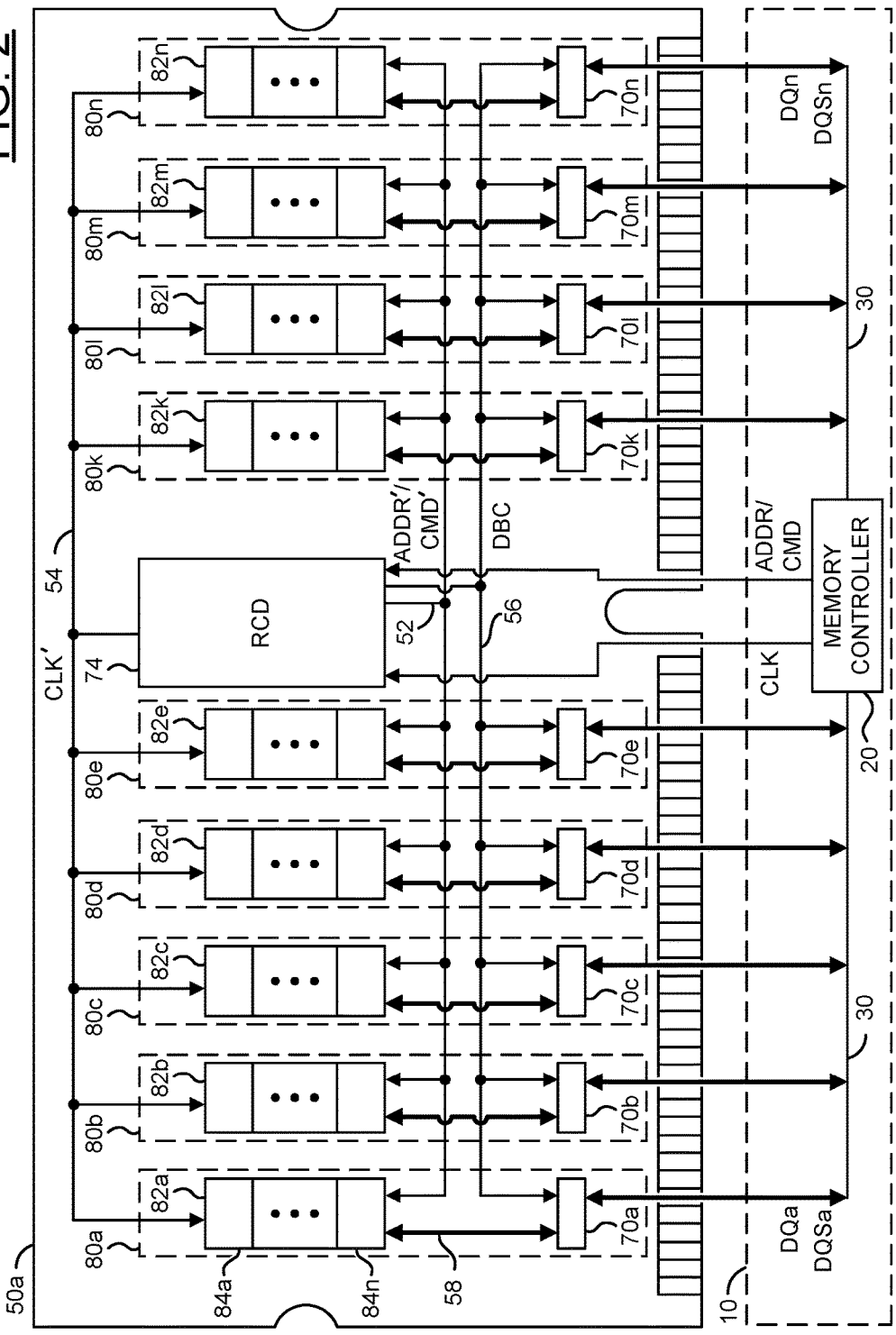
FIG. 2 is a block diagram illustrating a memory module of FIG. 1.

Referring to FIG. 2, a block diagram is shown illustrating a memory module 50a of FIG. 1. The memory module 50a may be representative of the memory modules 50b-50n. The memory module 50a is shown communicating with the memory controller 20. The memory controller 20 is shown as part of a block (or circuit) 10. The circuit 10 may be a motherboard (or main board), or other electronic component or computing engine that communicates with the memory module 50a.

The memory module 50a may comprise one or more blocks (or circuits) 80a-80n and/or the RCD circuit 74. The circuits 80a-80n may implement data paths of the memory module 50a. For example, the data path 80a may include a block 82a and/or the data buffer 70a. The data paths 80b-80n may have similar implementations. The circuits 82a-82n may each be implemented as a memory channel. Each of the memory channels 82a-82n may comprise a number of blocks (or circuits) 84a-84n. The circuits 84a-84n may be implemented as random access memory (RAM) chips. For example, the RAM chips 84a-84n may implement a volatile memory such as dynamic RAM (DRAM). The RAM chips 84a-84n may be the SDRAM devices 72a-72n (e.g., the chips 84a-84n may comprise one or more of the circuits 72a-72n located within one of the memory channels 82a-82n). In some embodiments, the RAM chips 84a-84n may be physically located on both sides (e.g., the front and back) of the circuit board of the memory modules 50a-50n. A capacity of memory on the memory module 50a may be varied according to the design criteria of a particular implementation.

The memory controller 20 may generate a signal (e.g., CLK) and a number of control signals (e.g., ADDR/CMD). The signal CLK and/or the signals ADDR/CMD may be presented to the RCD circuit 74. A data bus 30 may be connected between the memory controller and the data paths 80a-80n. The memory controller 20 may generate and/or receive data signals (e.g., DQa-DQn) and data strobe signals (e.g. DQSa-DQSn) that may be presented/received from the data bus 30. Portions of the signals DQa-DQn and DQSa-DQSn may be presented to respective data paths 80a-80n.

The RCD circuit 74 may be configured to communicate with the memory controller 20, the memory channels 82a-82n and/or the data buffers 70a-70n. The RCD circuit 74 may decode instructions received from the memory controller 20. For example, the RCD circuit 74 may receive register command words (RCWs). In another example, the RCD circuit 74 may receive buffer control words (BCWs). The RCD circuit 74 may be configured to train the DRAM chips 84a-84n, the data buffers 70a-70n and/or command and address lines between the RCD circuit 74 and the memory controller 20. For example, the RCWs may flow from the memory controller 20 to the RCD circuit 74. The RCWs may be used to configure the RCD circuit 74.

The RCD circuit 74 may be used in both LRDIMM and RDIMM configurations. The RCD circuit 74 may implement a 32-bit 1:2 command/address register. The RCD circuit 74 may support an at-speed bus (e.g., a BCOM bus between the RCD circuit 74 and the data buffers 70a-70n). The RCD circuit 74 may implement automatic impedance calibration. The RCD circuit 74 may implement command/address parity checking. The RCD circuit 74 may control register RCW readback. The RCD circuit 74 may implement a 1 MHz inter-integrated circuit ($I^2C$) bus (e.g., a serial bus). Inputs to the RCD circuit 74 may be pseudo-differential using external and/or internal voltages. The clock outputs, command/address outputs, control outputs and/or data buffer control outputs of the RCD circuit 74 may be enabled in groups and independently driven with different strengths.

The RCD circuit 74 may receive the signal CLK and/or the signals ADDR/CMD from the memory controller 20. Various digital logic components of the RCD circuit 74 may be used to generate signals based on the signal CLK and/or the signals ADDR/CMD and/or other signals (e.g., RCWs).

The RCD circuit 74 may also be configured to generate a signal (e.g., CLK') and signals (e.g., ADDR'/CMD'). For example, the signal CLK' may be a signal Y_CLK in the DDR4 specification. The signal CLK' and/or the signals ADDR'/CMD' may be presented to each of the memory channels 82a-82n. For example, the signals ADDR'/CMD' and CLK' may be transmitted on a common bus 52 and a common bus 54, respectively. The RCD circuit 74 may generate one or more signals (e.g., DBC). The signals DBC may be presented to the data buffers 70a-70n. The signals DBC may implement data buffer control signals. The signals DBC may be transmitted on a common bus 56 (e.g., a data buffer control bus).

The data buffers 70a-70n may be configured to receive commands and data from the bus 56. The data buffers 70a-70n may be configured to generate/receive data to/from the bus 30. The bus 30 may comprise traces, pins and/or connections between the memory controller 20 and the data buffers 70a-70n. A bus 58 may carry the data between each of the data buffers 70a-70n and respective memory channels 82a-82n. The data buffers 70a-70n may be configured to buffer data on the buses 30 and 58 for write operations (e.g., data transfers from the memory controller 20 to the corresponding memory channels 82a-82n). The data buffers 70a-70n may be configured to buffer data on the buses 30 and 58 for read operations (e.g., data transfers from the corresponding memory channels 82a-82n to the memory controller 20).

The data buffers 70a-70n may exchange data with the DRAM chips 84a-84n in small units (e.g., 4-bit nibbles). In various embodiments, the DRAM chips 84a-84n may be arranged in multiple (e.g., two) sets. For two set/two DRAM chip (e.g., 84a-84b) implementations, each set may contain a single DRAM chip (e.g., 84a or 84b). Each DRAM chip 84a-84b may be connected to the respective data buffers 70a-70n through an upper nibble and a lower nibble. For two set/four DRAM chip (e.g., 84a-84d) implementations, each set may contain two DRAM chips (e.g., 84a-84b or 84c-84d). A first set may be connected to the respective data buffers 70a-70n through the upper nibble. The other set may be connected to the respective data buffers 70a-70n through the lower nibble. For two set/eight DRAM chip (e.g., 84a-84h) implementations, each set may contain four of the DRAM chips 84a-84h. A set of four DRAM chips (e.g., 84a-84d) may connect to the respective data buffers 70a-70n through the upper nibble. The other set of four DRAM chips (e.g., 84e-84h) may connect to the respective data buffers 70a-70n through the lower nibble. Other numbers of sets, other numbers of DRAM chips, and other data unit sizes may be implemented to meet the design criteria of a particular implementation.

The DDR4 LRDIMM configuration may reduce a number of data loads to improve signal integrity on a data bus (e.g., the bus 30) of the memory module from a maximum of several (e.g., four) data loads down to a single data load. The distributed data buffers 70a-70n may allow DDR4 LRDIMM designs to implement shorter I/O trace lengths compared to DDR3 LRDIMM designs, which use a centralized memory buffer. For example, shorter stubs connected to the memory channels 82a-82n may result in less pronounced signal reflections (e.g., improved signal integrity). In another example, the shorter traces may result in a reduction in latency (e.g., approximately 1.2 nanoseconds (ns), which is 50% less latency than DDR3 buffer memory). In yet another example, the shorter traces may reduce I/O bus turnaround time. For example, without the distributed data buffers 70a-70n (e.g., in DDR3 memory applications) traces would be routed to a centrally located memory buffer, increasing trace lengths up to six inches compared to the DDR4 LRDIMM implementation shown in FIG. 2.

In some embodiments, the DDR4 LRDIMM configuration may implement nine of the data buffers 70a-70n. The memory modules 50a-50n may implement 2 millimeter (mm) frontside bus traces and backside traces (e.g., the connectors/pins/traces 60). A propagation delay through the data buffers 70a-70n may be 33% faster than through a DDR3 memory buffer (e.g., resulting in reduced latency). In some embodiments, the data buffers 70a-70n may be smaller (e.g., a reduced area parameter) than a data buffer used for DDR3 applications.

Figure 3:
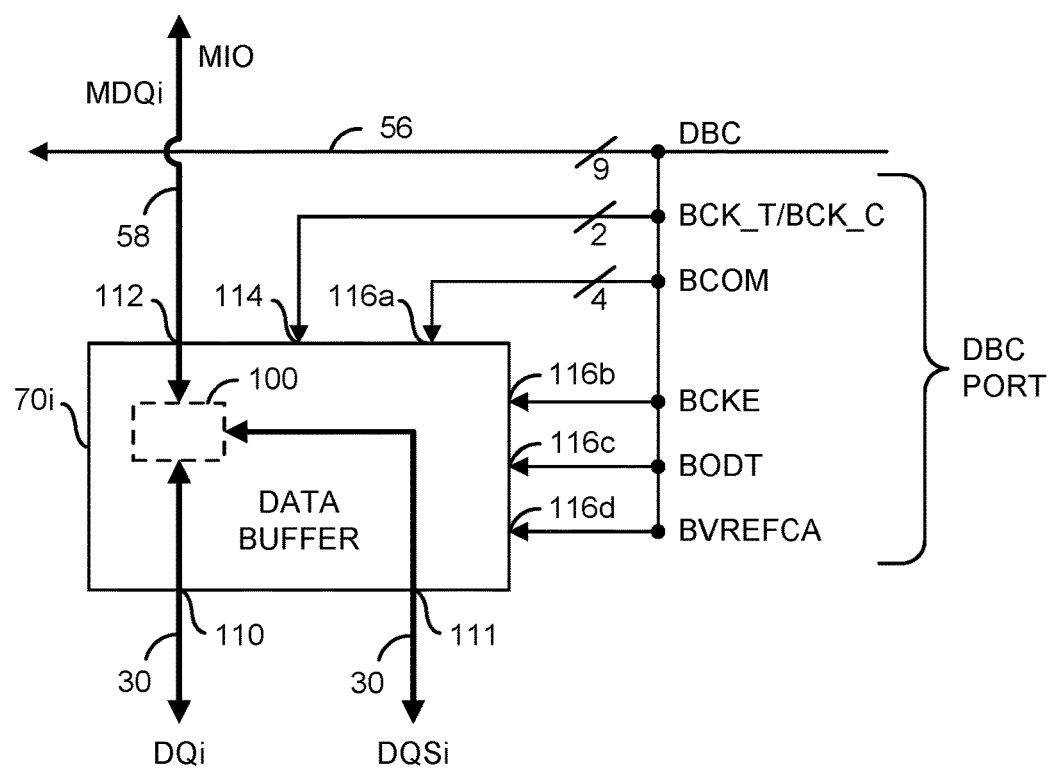
FIG. 3 is a block diagram illustrating an example data buffer of FIG. 1.

Referring to FIG. 3, a diagram is shown illustrating a data buffer 70i in accordance with an example embodiment of the invention. The data buffer 70i may be representative of an example embodiment of the data buffers 70a-70n. The data buffer 70i is shown having a first input/output 110, a second input/output 111, and a third input/output 112.

The first input/output 110 is configured for presenting/receiving the signals DQi (e.g., the data signals DQ corresponding to a memory channel) between the data buffer 70i and the controller 20. The second input/output 111 is configured for presenting/receiving the signals DQSi (e.g., the data strobe signals DQS corresponding to the memory channel) between the data buffer 70i and the controller 20. The third input/output 112 is configured for presenting/receiving the signals DQi as memory input/output (MIO) signals (e.g., MDQi) corresponding to a memory channel between the data buffer 70i and the respective memory devices (e.g., DRAM chips) 72a-72n.

The signals MDQi are generally transmitted between the memory modules 72a-72n and the respective data buffer 70a-70n. In an example, data (e.g., the signals DQi) from the memory controller 20 may be presented to the data buffer 70i, buffered in the data buffer 70i, then transmitted to the respective memory device(s) 72a-72n. In another example, data from the respective memory device(s) 72a-72n may be presented to the data buffer 70i, buffered in the data buffer 70i, and then transmitted on an appropriate memory channel to the memory controller 20.

The data buffer 70i is shown also receiving signals (e.g., DBC) from the bus 56 at a control port (e.g., DBC PORT). The signals DBC may be presented to the data buffers 70a-70n (e.g., using the data buffer control bus 56). In an example, the signals DBC are illustrated comprising five signals transmitted over 9 pins/bits (e.g., a pair of signals BCK_T/BCK_C, a signal BCOM, a signal BCKE, a signal BODT and/or a signal BVREFCA). However, other numbers of pins/bits may be implemented accordingly to meet the design criteria of a particular application. The control port of the data buffer 70i is shown having an input 114 receiving the signals BCK_T/BCK_C, an input 116a receiving the signal BCOM, an input 116b receiving the signal BCKE, an input 116c receiving the signal BODT, and an input 116d receiving the signal BVREFCA.

In various embodiments, the signals BCK_T/BCK_C may be implemented as a 2-bit signal representing a differential (e.g., true (T) and complementary (C) versions) clock signal for the duplex data buffers 70a-70n. In various embodiments, the signal BCOM may be implemented as a 4-bit signal representing data buffer commands. However, other numbers of bits may be implemented accordingly to meet the design criteria of a particular application. The signal BCOM may be implemented as a unidirectional signal from the RCD circuit 74 to the data buffers 70a-70n. In an example, the signal BCOM may be implemented at a single data rate (e.g., 1 bit per signal per clock cycle). However, a particular command may take a different number of clock cycles to transfer information. The signal BCKE may be a function registered dedicated non-encoded signal (e.g., DCKE). The signal BODT may be a function registered dedicated non-encoded signal (e.g., DODT). The signal BVREFCA may be a reference voltage for use with pseudo-differential command and control signals.

The data buffers 70a-70n may receive a set of data buffer commands (e.g., for writing buffer control words (BCWs)) from the signals DBC. The buffer control words may be used to customize operation of the data buffers 70a-70n. The buffer control words may flow from the memory controller 20, through the RCD circuit 74, to the data buffers 70a-70n. The buffer control words may be similar to register control words (RCWS) used for configuring the RCD circuit 74. Similar to commands for writing the register control words, the commands for writing the buffer control words may look like an MRS7 command, where the address lines are really the payload.

In embodiments where the bus 56 comprises nine pins, the RCD circuit 74 may do more than pass a buffer control word directly through to the data buffers 70a-70n. In one example, the RCD circuit 74 may convert (e.g., multiplex) an MRS7 command format into a buffer control word in a BCOM format. The RCD circuit 74 may map the 12 address bits of the MRS7 command into five separate data transfers, each 4 bits wide. The five data transfers may be set up back to back over the bus 56. For example, 5 clock cycles plus a parity cycle may be used to complete the buffer command in the buffer control word. Once the buffer control word reaches the data buffers 70a-70n, the data buffers 70a-70n may decode the buffer control word, write the buffer control word to a function space of the data buffer, and complete the buffer command in the buffer control word.

A function of the signal BCOM may be to transmit the buffer control words. However, compliant with the JEDEC specification for DDR4 SDRAM, the RCD circuit 74 may send all read/write commands and MRS information over the bus 56 (e.g., to allow the data buffers 70a-70n to keep track of what the memory devices 72 are doing). In some embodiments, different buffer commands may take a different number of cycles to transfer the information.

The RCD circuit 74 may receive an MRS7 command from the memory controller 20 (e.g., from a host). For example, a host may want to change a parameter (e.g., typically on initialization or boot up of a computing device). The RCD circuit 74 may check the MRS7 command to determine whether the address bit 12 is set to 1 (e.g., a logical one). In an example, when an address bit 12 of the MRS7 command is set to 1, the RCD circuit 74 may recognize the command as a buffer command (e.g., a command that is not meant for the RCD circuit 74). The RCD circuit 74 may convert the command from the memory controller 20 to a buffer control word and send the buffer control word to the data buffers 70a-70n via the bus 56. The data buffers 70a-70n may write the buffer control word to a function space to complete the command.

The data buffers 70a-70n may be configurable. The buffer commands may allow the memory controller 20 to customize aspects of termination (e.g., ODT), signal strength on the DQ lines, and/or events (e.g., receiver timing, driver timing, etc.) in both directions (e.g., for both read and write operations). In some embodiments, some of the configurations of the data buffers 70a-70n may be decided based on system level configurations. Generally, most of the configuration of the data buffers 70a-70n may be decided during training steps. During training steps, host controllers (e.g., the memory controller 20) may test and compare results of various training steps to determine an optimal configuration.

In various embodiments, the bus 56 may be used to send commands/data to program configuration registers of the data buffers 70a-70n. The bus 56 may also send commands (e.g., data reads and/or data writes) that control data traffic through the data buffers 70a-70n. For example, some commands may optimize power consumption and noise filtering (e.g. equalization) of the data buffers 70a-70n. In another example, read/write delays may be added per data line.

The data buffers 70a-70n may implement dual multi-bit (e.g., 4-bit) bidirectional data registers with differential data strobes (e.g., DQS_T/DQS_C). The data buffers 70a-70n may implement automatic impedance calibration. The data buffers 70a-70n may implement BCOM parity checking. The data buffers 70a-70n may implement control register (e.g., buffer control word) readback.

In some embodiments, the data buffers 70a-70n may comprise a block (or circuit) 100. The circuit 100 may be configured to implement a resynchronization of a clock signal associated with transmitting each data bit. In one example, the circuit 100 may be implemented using phase-locked loop (PLL) circuits and/or delay-locked loop (DLL) circuits. In another example, the circuit 100 may be implemented using a phase adjuster circuit. Details of the circuit 100 may be described in association with FIGS. 5-7.

Figure 4:
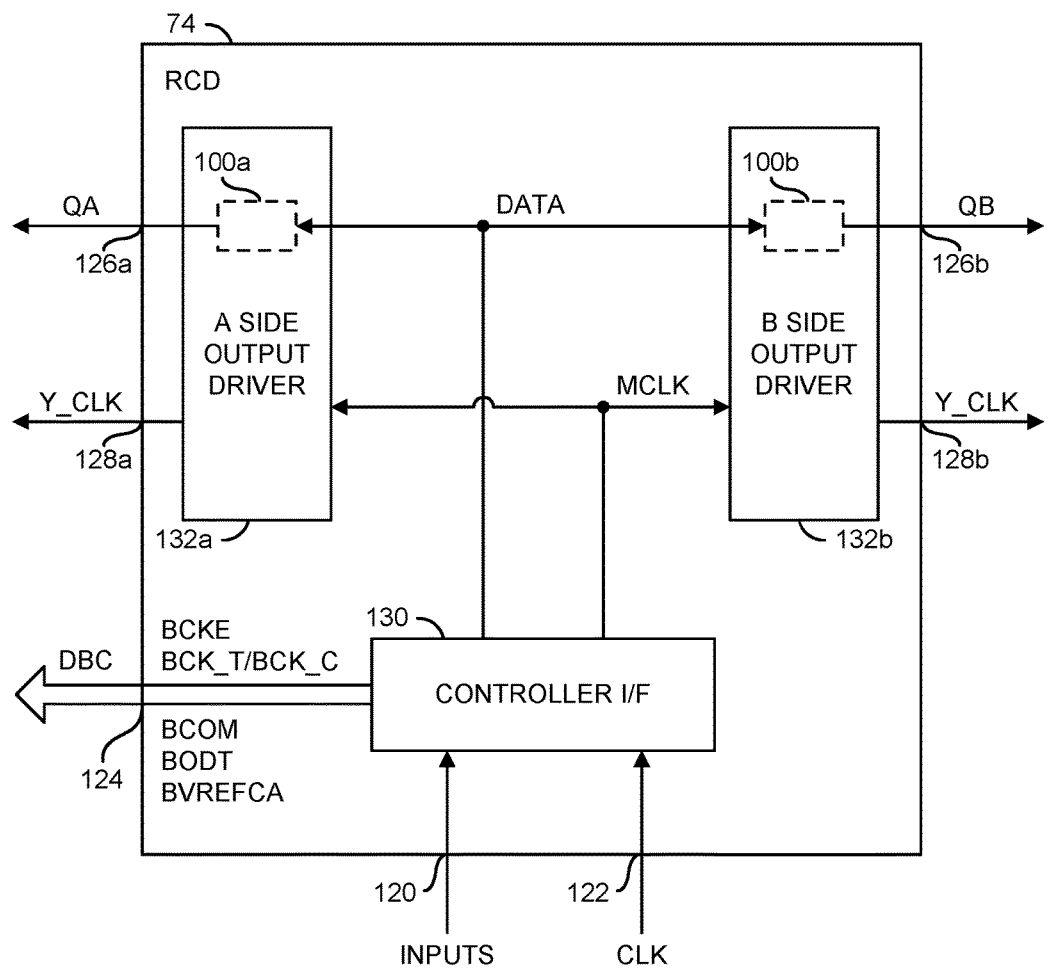
FIG. 4 is a diagram illustrating a registered clock driver (RCD) in accordance with an embodiment of the invention.

Referring to FIG. 4, a diagram is shown illustrating a registered clock driver in accordance with an embodiment of the invention. In various embodiments, a circuit 74 may implement a registered clock driver circuit (or chip). In various embodiments, the circuit 74 may be JEDEC compliant (e.g., compliant with the DDR4 specification entitled "DDR4 SDRAM", specification JESD79-4A, November 2013, published by the Joint Electron Device Engineering Council (JEDEC) Solid State Technology Association, Arlington, Va.).

The circuit 74 may have an input 120 that receives input data (e.g., INPUTS), an input 122 that receives the clock signal CLK, an input/output 124 that may receive/transmit control information (e.g., DBC), outputs 126a and 126b that may provide data outputs (e.g., the Q outputs QA and QB, respectively) and outputs 128a and 128b that may provide output clock signals (e.g., Y_CLK). The signals INPUTS and CLK may be received from a memory controller (e.g., the memory controller 20 in FIG. 1) via a memory bus of a motherboard. In an example, the signals INPUTS may be pseudo-differential using an external or internal voltage reference. The signals INPUTS may comprise the ADDR/CMD signals of FIGS. 1 and 2. In an example, the signal CLK may be implemented as differential clock signals CLK_t (true) and CLK_c (complement). The signals QA, QB, and Y_CLK may be presented to a number of memory chips (e.g., 84a-84n in FIG. 2). For example, the signals QA, QB and Y_CLK may implement an output address and control bus for a DDR4 RDIMM, DDR4 LRDIMM, DDR4 UDIMM and/or DDR5 memory module. The signal DBC may be implemented as a data buffer control bus.

In various embodiments the circuit 74 may comprise a block 130, a block (or circuit) 132a and/or a block (or circuit) 132b. The block 130 may implement a controller interface. The blocks 132a and 132b may implement output driver circuits. In some embodiments, the blocks 132a and 132b may be combined as a single circuit 132. The block 130 may be configured to generate a data signal (e.g., DATA) and a clock signal (e.g., MCLK). The block 130 may be configured to generate the pair of signals BCK_T/BCK_C, the signal BCOM, the signal BCKE, the signal BODT and/or the signal BVREFCA. The signals DATA and MCLK may be presented to the blocks 132a and 132b. In various embodiments, the signal DATA may be coupled to the blocks 132a and 132b by combinatorial logic (not shown). The blocks 132a and 132b may be configured to generate the signals QA, QB and Y_CLK.

In various embodiments, the circuit 74 may be enabled to automatically adjust a skew time of a plurality of output pins during a manufacturing test operation. In various embodiments, the circuit 74 may be enabled to adjust the skew time (e.g., tSkew) to within a single gate delay of a reference output clock. As used herein, the term tSkew may be defined as the phase difference between an output data signal or pin (e.g., Q) and an output clock signal or pin (e.g., Y_CLK). In an example, a DDR4 registered clock driver (RCD) may have sixty-six output pins. However, other numbers of output pins may be implemented to meet the design criteria of a particular implementation (e.g., a DDR5 implementation).

The circuit 74 may be configured to adjust the phase of the output pins relative to the clock signal Y_CLK (or to respective copies of the clock signal Y_CLK) to meet manufacturer specifications (e.g., within +/−50 ps, etc.). The granularity of the phase adjustment is generally determined by delay elements within the circuit 74. During production testing, the circuit 74 may be configured to perform a trimming process in response to signals from automated test equipment and provide a pass/fail indication to the automated test equipment. In various embodiments, the circuit 74 may be utilized to implement the RCD in DDR4 RDIMM, DDR4 LRDIMM, DDR4 UDIMM and/or DDR5 memory modules.

In some embodiments, the RCD circuit 74 may comprise the blocks (or circuits) 100a-100b. The circuit 100a and the circuit 100b may be implemented in the circuit 132a and the circuit 132b, respectively. In some embodiments, where the RCD circuit 74 implements a single output driver 132, the RCD circuit 74 may comprise the circuit 100. The circuit 100 and/or the circuits 100a-100b may have similar implementations. The circuits 100a-100b may be configured to implement the resynchronization of the clock signal associated with transmitting each data bit. Details of the circuit 100a-100b may be described in association with FIGS. 5-7.

Figure 5:
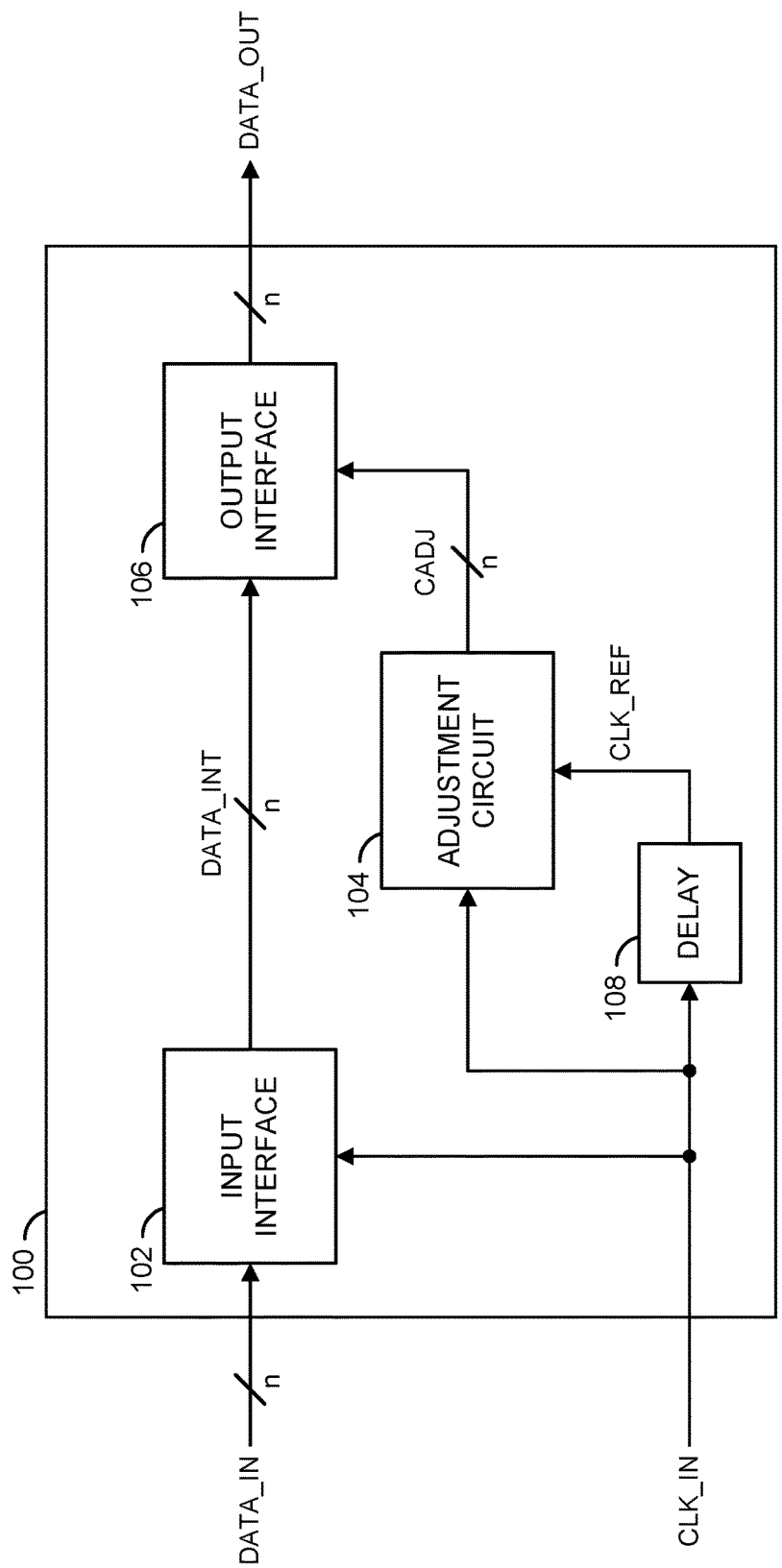
FIG. 5 is a block diagram illustrating an example embodiment of the present invention.

Referring to FIG. 5, a block diagram illustrating the clock resynchronization circuit 100 is shown. The clock resynchronization circuit 100 may comprise a block (or circuit) 102, a block (or circuit) 104, a block (or circuit) 106 and/or a block (or circuit) 108. The circuit 102 may implement an input interface. The circuit 104 may implement an adjustment circuit. The circuit 106 may implement an output interface. The circuit 108 may implement a variable delay. Each of the circuits 102-108 may comprise one or more blocks (or circuits). The number and/or types of components implemented by the clock resynchronization circuit 100 may be varied according to the design criteria of a particular implementation.

The clock resynchronization circuit 100 may receive a signal (e.g., DATA_IN). The clock resynchronization circuit 100 may receive a signal (e.g., CLK_IN). The signal CLK_IN may be an input clock signal. The signal DATA_IN may transmit input data. The clock resynchronization circuit 100 may present a signal (e.g., DATA_OUT). The signal DATA_OUT may transmit output data. The signal DATA_OUT may comprise n bits (e.g., signals DATA_OUT1-DATA_OUTN).

In some embodiments (e.g., when the clock resynchronization circuit 100 is implemented as part of one of the data buffers 70a-70n), the signal DATA_IN may be the signal DQ and/or DQi. In some embodiments, (e.g., when the clock resynchronization circuit 100 is implemented as part of the RCD circuit 74), the signal DATA_IN may be the signal DATA. In some embodiments, (e.g., when the clock resynchronization circuit 100 is implemented as part of one of the data buffers 70a-70n), the signal DATA_OUT may be the signal MDQ. In some embodiments, (e.g., when the clock resynchronization circuit 100 is implemented as part of the RCD circuit 74), the signal DATA_OUT may be implemented as one or more of the Q outputs (e.g., QA and/or QB). In some embodiments (e.g., when the clock resynchronization circuit 100 is implemented as part of one of the data buffers 70a-70n), the signal CLK_IN may be one or more of the signals BCK_T and/or BCK_C. In some embodiments, (e.g., when the clock resynchronization circuit 100 is implemented as part of the RCD circuit 74), the signal CLK_IN may be the signal MCLK.

The input interface 102 may receive the signal DATA_IN and the signal CLK_IN. The input interface 102 may present a signal (e.g., DATA_INT). The signal DATA_INT may be an intermediate data signal. The signal DATA_INT may comprise n bits (e.g., signals DATA_INT1-DATA_INTN). The adjustment circuit 104 may receive the signal CLK_IN and a signal (e.g., CLK_REF). The signal CLK_REF may be a delayed version of the signal CLK_IN. The adjustment circuit 104 may present a signal (e.g., CADJ). The signal CADJ may be an adjusted version of the signal CLK_IN. The signal CADJ may comprise n bits (e.g., signals CADJ1-CADJN). The output interface 106 may receive the signal DATA_INT and the signal CADJ. The output interface 106 may present the signal DATA_OUT.

The variable delay 108 may receive the signal CLK_IN. The variable delay 108 may present a delayed version of the signal CLK_IN. The delay may be generated to enable the adjustment circuit 104 to resynchronize the signal CLK_IN in response to a delay caused by clock lines and/or a clock tree. For example, the variable delay 108 may be generated in response to a delay inherent to the circuitry of the data buffers 70a-70n and/or the RCD circuit 74. The variable delay 108 may present the signal CLK_REF. The signal CLK_REF may be a reference clock signal. The signal CLK_REF may be presented to the adjustment circuit 104.

The clock resynchronization circuit 100 may be configured to reduce and/or eliminate mismatch between bit to bit delay and clock tree delay. The clock resynchronization circuit 100 may be implemented as a component of the data buffers 70a-70n and/or as a component in the RCD circuit 74. The adjustment circuit 104 may be implemented near the output interface 106 to resynchronize the signal CLK_IN for each bit transmitted in the signal DATA_IN. Resynchronizing the reference clock signal CLK_IN may clean up jitter and/or skew (e.g., adjust tSkew) through the clock line and/or clock tree.

In some embodiments, a fabrication process size for designing and/or manufacturing components of the memory circuits 50a-50n, the components of the data buffers 70a-70n, the components of the RCD circuit 74 and/or the components of the circuit 100 may be in a range of 28 nm to 65 nm. In some embodiments, the fabrication process size may be less than 28 nm. In some embodiments, the fabrication process size may be greater than 65 nm. For example, in a DDR4 implementation, the fabrication process size may be 65 nm. Implementing a small fabrication size (e.g., at most 40 nm), may enable components of the adjustment circuit 104 to be located near (e.g., placed next to) each component of the output interface 106. In some embodiments, the components of the memory circuits 50a-50n, the components of the data buffers 70a-70n, the components of the RCD circuit 74 and/or the components of the circuit 100 (e.g., the adjustment components 214a-214n) may be implemented using FinFET technology. For example, FinFET technology may comprise a three-dimensional bar on top of a silicon substrate (e.g., a fin). Implementing FinFET technology instead of planar FET technologies may decrease power consumption, increase switching speed, decrease switching voltage and/or decrease a fabrication size to a range of 10 nm-22 nm. The fabrication process size may be varied according to the design criteria of a particular implementation.

The clock resynchronization circuit 100 may clean up jitter and reduce skew by grouping portions of the output interface 106. Components of the adjustment circuit 104 may be paired with components of the output interface 106 to create local groups (e.g., output stage groups). The groups may be synchronized with each other (e.g., one group of the output stages may be synchronized with another group of the output stages of the output interface 106). The clock resynchronization circuit 100 may be configured to clean up variation and/or mismatch between groups having distant locations from each other in a large area and assume local variation and/or mismatch (e.g., variation within each group) may be relatively small. For example, the variation within each of the groups may be negligible compared to the variation between each of the groups that have distances that are relatively large.

Figure 6:
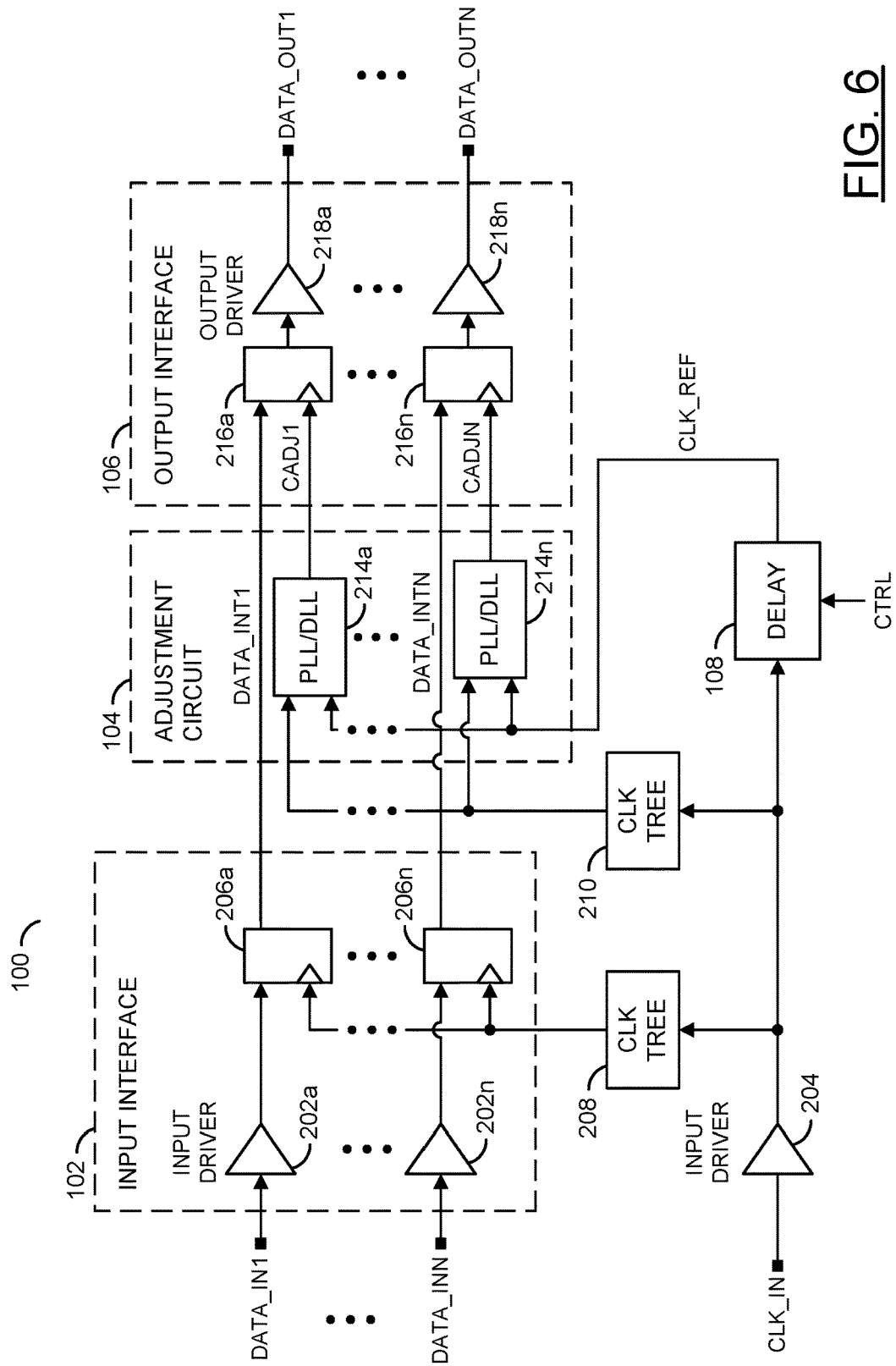
FIG. 6 is a diagram illustrating an example embodiment of resynchronization of a clock for data bits using a phase-locked loop (PLL) or a delay-locked loop (DLL)

Referring to FIG. 6, a diagram illustrating an example embodiment of the resynchronization circuit 100 implemented using a phase-locked loop (PLL) or a delay-locked loop (DLL) is shown. Components of the input interface 102, the adjustment circuit 104 and/or the output interface 106 are shown. The circuits 102-106 may comprise other components (not shown). The number and/or types of components implemented in the circuits 102-106 may be varied according to the design criteria of a particular implementation.

The input interface 102 may receive one or more signals (e.g., DATA_IN1-DATA_INN). The signals DATA_IN1-DATA_INN may be data bits of the signal DATA_IN. In one example, the number of bits may be 16 (e.g., DATA_IN1-DATA_IN16). In another example, the number of bits may be 32 (e.g., DATA_IN1-DATAIN32). In yet another example, the number of bits may be 64 (e.g., DATA_IN1-DATA_IN64). The number of bits received and/or transmitted by the input interface 102 may be varied according to the design criteria of a particular implementation.

The signals DATA_IN1-DATA_INN and/or the signal CLK_IN may each be received by an input driver circuit. The input interface 102 may comprise a plurality of input drivers 202a-202n. The input drivers 202a-202n may receive the signals DATA_IN1-DATA_INN. The resynchronization circuit 100 may comprise an input driver 204. The input driver 204 may receive the input clock signal CLK_IN. The number of input drivers implemented may be varied based on the number of data input signals (e.g., DATA_IN1-DATA_INN) and/or input clock signals (e.g., CLK_IN).

The input interface 102 may comprise a number of blocks (or circuits) 206a-206n. The circuits 206a-206n may implement flip-flop circuits. In one example, the circuits 206a-206n may be D-type flip-flops. Each of the flip-flops 206a-206n may receive a respective one of the signals DATA_IN1-DATA_INN (e.g., at a D input of a D-type flip-flop circuit). For example, the input drivers 202a-202n may each transfer one of the data signals DATA_IN1-DATA_INN to one of the flip-flops 206a-206n. Each of the flip-flops 206a-206n may receive the clock signal CLK_IN (e.g., at a clock input of the D-type flip-flop).

Each of the flip-flops 206a-206n may present one intermediate signal (e.g., DATA_INT1-DATA_INTN). The intermediate signals DATA_INT1-DATA_INTN may be data bits of the intermediate signal DATA_INT. The number of data bits in the intermediate signal DATA_INT may correspond to the number of data bits in the signal DATA_IN. The signals DATA_INTA-DATA_INTN may be presented by a Q output of the D-type flip-flops 206a-206n.

The input interface 102 may comprise a number of input stages (or input channels). Generally, the input interface 102 comprises at least two input stages. Each input stage of the input interface 102 may comprise one of the input drivers 202a-202n and one of the flip-flops 206a-206n. In one example, one input stage of the input interface 102 may be the input driver 202a and the flip-flop 206a and the input stage may receive the data input signal DATA_IN1 and present the intermediate signal DATA_INT1. In another example, one input stage of the input interface 102 may be the input driver 202i and the flip-flop 206i and the input stage may receive the data input signal DATA_INI and present the intermediate signal DATA_INTI. The number of data input stages implemented by the input interface 102 may correspond to the number of bits in the input data signal DATA_IN.

The input driver 204 may present the signal CLK_IN to a block (or circuit) 208 and/or a block (or circuit) 210. The circuit 208 and/or the circuit 210 may implement a clock tree. The clock tree 208 and/or the clock tree 210 may comprise a complex network of traces and/or connections. The clock tree 208 and/or the clock tree 210 may transfer the signal CLK_IN to the various components of the resynchronization circuit 100. In one example, the clock tree 208 may present the signal CLK_IN to each of the flip-flops 206a-206n (e.g., the input clock signal CLK_IN may be presented through the clock tree 208). Similarly, the input clock signal CLK_IN may be presented to the adjustment circuit 104 through the clock tree 210.

The clock tree 208 and/or the clock tree 210 may cause a mismatch between the timings of the transmission of the data bits. For example, the flip-flop 206a may not transmit the signal DATA_INT1 until the signal CLK_IN is received from the clock tree 208. Similarly, the flip-flop 206n may not transmit the signal DATA_INTN until the signal CLK_IN is received from the clock tree 208. However, the complexity of the clock tree 208 may introduce a delay. For example, the flip-flop 206a may be farther away from the input driver 204 than the flip-flop 206n. The flip-flop 206n may receive the signal CLK_IN before the flip-flop 206a. Since the flip-flop 206n receives the signal CLK_IN earlier, the flip-flop 206n may present the signal DATA_INTN before the flip-flop 206a presents the signal DATA_INT1. The mismatch between the transmission of the data bits caused by the clock tree 208 and/or the clock tree 210 may result in skew (e.g., the tSkew).

The input driver 204 may present the signal CLK_IN to the variable delay circuit 108. The variable delay circuit 108 may present the signal CLK_REF to the adjustment circuit 104. The signal CLK_REF may be a reference clock signal for the adjustment circuit 104. The variable delay circuit 108 may be varied based on a signal (e.g., CTRL). The signal CTRL may be generated to adjust the amount of delay for the signal CLK_REF. In an example, the signal CTRL may be a feedback signal. The signal CLK_REF may be generated to match a timing of the input stages of the input interface 102 and/or output stages of the output interface 106.

The adjustment circuit 104 may be configured to fix (e.g., resynchronize) the mismatch between the transmission of the data bits caused by the clock tree 208 and/or the clock tree 210. The adjustment circuit 104 may be located near the output interface 106. For example, the adjustment circuit 104 may be located closer to the output interface 106 than the input interface 102. In another example, the adjustment circuit 104 may be located near the output interface 106 by having no other components located between the adjustment circuit 104 and the output interface 106. The adjustment circuit 104 may comprise a number of blocks (or circuits) 214a-214n. The circuits 214a-214n may be adjustment components. The adjustment circuit 104 may comprise other components (not shown). The components implemented by the adjustment circuit 104 may be varied according to the design criteria of a particular implementation.

Generally, the adjustment circuit 104 may comprise more than one of the adjustment components 214a-214n. In one example, the adjustment circuit 104 may implement one of the adjustment components 214a-214n for each of the input stages of the input interface 102 (or output stages of the output interface 106). Generally, the number of input stages of the input interface 104, the number of adjustment components 214a-214n of the adjustment circuit 104 and the number of output stages of the output interface 106 are the same. In some embodiments, the adjustment components 214a-214n may be implemented as phase-locked loop (PLL) circuits. In some embodiments, the adjustment components 214a-214n may be implemented as delay-locked loop (DLL) circuits. In some embodiments, the adjustment components 214a-214n may be implemented as a combination of PLL and DLL circuits. The number and/or types of circuits used for implementing the adjustment components 214a-214n may be varied according to the design criteria of a particular implementation.

The adjustment circuit 104 may receive the signal CLK_IN and the signal CLK_REF. For example, each one of the adjustment components 214a-214n may receive the signal CLK_IN via the clock tree 210. The signal CLK_REF may be generated to control the delay of the adjustment components 214a-214n. For example, the signal CLK_REF may be a delay signal received by each of the adjustment components 214a-214n. The adjustment circuit 104 may present one or more signals (e.g., CADJ1-CADJN). The signals CADJ1-CADJN may be the clock adjustment signal (e.g., CADJ) for each of the output stages of the output interface 106. For example, each one of the adjustment components 214a-214n may present one of the clock adjustment signals CADJ1-CADJN. In some embodiments, the adjustment circuit 104 may pass through the intermediate signals DATA_INT1-DATA_INTN to the output interface 106. In some embodiments, the intermediate signals DATA_INT1-DATA_INTN may be routed around the adjustment circuit 104 (e.g., presented by the input interface 102 to the output interface 106).

The output interface 106 may receive the intermediate signals DATA_INT1-DATA_INTN and/or the adjustment clock signals CADJ1-CADJN. The output interface 106 may present a number of signals (e.g., DATA_OUT1-DATA_OUTN). The signals DATA_OUT1-DATA_OUTN may be bits of the output signal DATA_OUT. The number of the output signals DATA_OUT1-DATA_OUTN may correspond to the number of the input signals DATA_IN1-DATA_INN and/or the number of the intermediate signals DATAINT1-DATAINTN.

The output interface 106 may comprise a number of blocks (or circuits) 216a-216n and/or a number of blocks (or circuits) 218a-218n. The circuits 216a-216n may implement flip-flop circuits. In one example, the circuits 216a-216n may be D-type flip-flops. Each of the flip-flops 216a-216n may receive a respective one of the signals DATA_INT1-DATA_INTN. For example, the input stages of the input interface 102 may each transfer one of the intermediate data signals DATA_INT1-DATA_INTN to one of the flip-flops 216a-216n.

Each of the flip-flops 216a-216n may receive a respective one of the adjusted clock signals CADJ1-CADJN. For example, the adjustment components 214a-214n of the adjustment circuit 104 may each transfer one of the adjusted clock signals CADJ1-CADJN to one of the flip-flops 216a-216n. The adjusted clock signals CADJ1-CADJN may be implemented to ensure a timing match between the data bits transferred from the input interface 106 to the output interface 106. Each of the flip-flops 216a-216n may be configured to present one of the signals DATA_OUT1-DATA_OUTN to the circuits 218a-218n. For example, the flip-flops 216a-216n may each receive one of the intermediate data signals DATA_INT1-DATA_INTN at the D input, one of the adjusted clock signals CADJ1-CADJN at the clock input and present one of the signals DATA_OUT1-DATA_OUTN at the Q output.

The circuits 218a-218n may be output drivers. The output drivers may communicate the signals DATA_OUT1-DATA_OUTN received from the flip-flops 216a-216n as data output. The signals DATA_OUT1-DATA_OUTN may be the output of the output interface 106 and/or the resynchronization circuit 100. For example, the output interface 106 may implement one of the output drivers 218a-218n for each of the flip-flops 216a-216n.

The output interface 106 may comprise a number of output stages (or output channels). Generally, the output interface 106 comprises at least two output stages. Each output stage of the output interface 106 may comprise one of the flip-flops 216a-216n and one of the output drivers 218a-218n. In one example, one output stage of the output interface 106 may be the flip-flop 216a and the output driver 218a and the output stage may receive the intermediate data input signal DATA_INT1 and the adjusted clock signal CADJ1 and present the output data signal DATA_OUT1. In another example, one output stage of the output interface 106 may be the flip-flop 216i and the input driver 218i and the output stage may receive the intermediate data input DATA_INTI and the adjusted clock signal CADJI and present the output data signal DATA_OUTI. The number of output stages implemented by the output interface 106 may correspond to the number of bits in the output data signal DATA_OUT.

The adjustment circuit 104 may be located near the output interface 106. Each sub-system may comprise one of the adjustment components 214a-214n and one of the output stages. The adjustment circuit 104 may be placed in each sub-system. For example, each of the adjustment components 214a-214n may be placed right next to one of the flip-flops 216a-216n of the output interface 106. Placing the adjustment components 214a-214n right next to one of the flip-flops 216a-216n may replace conventional designs that use a central PLL circuit within a chip to deliver a clock to each sub-system (e.g., output stage). Implementing a central PLL uses a clock tree distribution and driving buffers to deliver clock signals to output flip-flops and the number of buffers and long trace of the path makes matching the channel and controlling the delay difficult. Placing the adjustment components 214a-214n right next to (or near) one of the flip-flops 216a-216n enables the circuit 100 to reduce a mismatch in the timing of the various input stages and/or output stages.

Placing the adjustment components 214a-214n (e.g., PLLs and/or DLLs) near the output stages (or pins) may resync the clocks (e.g., the adjusted clock signals CADJ1-CADJN) for each bit and/or clean up the jitter and skew through the clock line and tree. With the fabrication process size reduced to 40 nm, 28 nm and/or even less, the adjustment components 214a-214n (e.g., digital and/or conventional PLL and/or DLL) may be implemented having a small size. A small size for the adjustment components 214a-214n may enable the adjustment components 214a-214n to be placed near the output stages of the output interface 106.

The adjustment components 214a-214n may be designed without having low-dropout (e.g., LDO) regulators. For example, digital and/or conventional PLL circuits and/or DLL circuits may be designed without having the LDO regulator embedded. Designing the adjustment components 214a-214n without the LDO embedded may save the LDO and/or an analog bump. Without the LDO and/or the analog bump, the adjustment components 214a-214n may be designed to be very small. Implementing the adjustment components 214a-214n having the small size may enable the adjustment components 214a-214n to be placed near each of output stages (e.g., the flip-flops 216a-216n).

The output interface 106 may comprise a large group of output stages. The output stages of the output interface 106 may be located at various distances from each other. The differences in the distances from the input interface 102 to the various output stages of the output interface 106 may cause a mismatch in the timings of transferring data bits. The variable delay 108 may be used to adjust the delay for the reference clock (e.g., the signal CLK_REF) for the adjustment components 214a-214n. Since the input clock signal CLK_IN goes through the clock tree 208 and/or the clock tree 210, a delay may be added to the input clock signal CLK_IN. The output stages may be grouped into local groups (e.g., output stages that are closer together may be grouped together). The adjustment components 214a-214n may be configured to sync up timings of one group with another group. For example syncing up groups may clean up the variation/mismatch from distant locations in a large area by assuming the local variation/mismatch to be relatively small compared to the variations/mismatches over the large area.

The adjustment circuit 104 may be configured to meet a skew specification of the DDR4 (or DDR5) specification. For example, implementing the adjustment components 214a-214n near the output interface 106 may enable the circuit 100 to balance the clock and data skew while transferring bits at a high data rate. The adjustment circuit 104 may be implemented to prevent skew from accumulating due to delay variation and/or mismatch between clock and data bits. The adjustment circuit 104 may be configured to resynchronize the input clock signal CLK_IN (e.g., generate the adjusted clock signals CADJ1-CADJN) for each bit transmitted from the input interface 102 to the output interface 106 to reduce and/or eliminate a mismatch between a bit to bit delay and a delay caused by the clock tree 208 and/or the clock tree 210.

Figure 7:
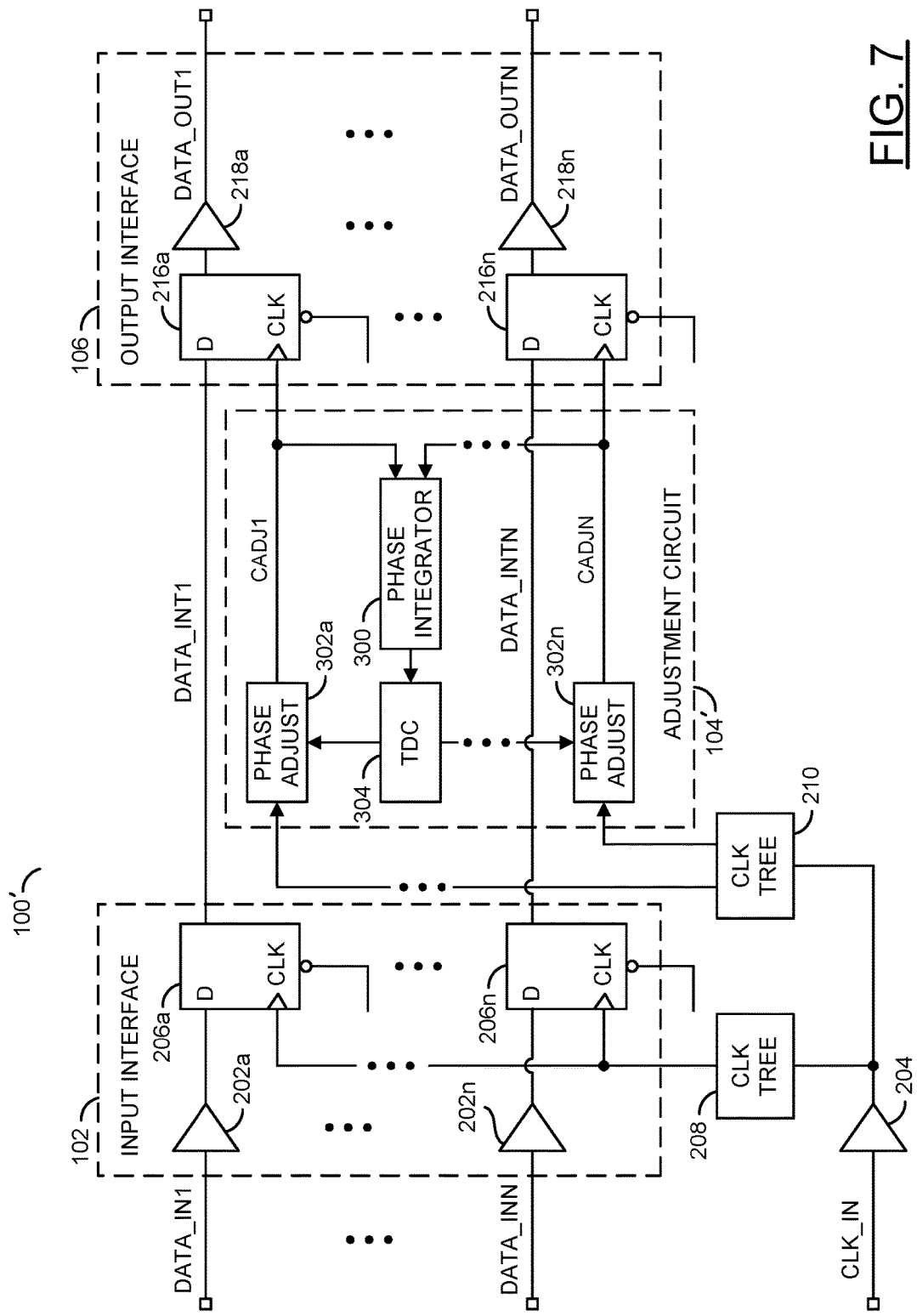
FIG. 7 is a diagram illustrating an example embodiment of resynchronization of a clock for data bits using a phase adjuster circuit.

Referring to FIG. 7, a diagram illustrating an example embodiment of the resynchronization circuit 100' implemented using phase adjuster circuit is shown. The resynchronization circuit 100' may comprise the input interface 102, the adjustment circuit 104', the output interface 106, the input driver 204, the clock tree 208 and/or the clock tree 210. The input interface 102 and/or the output interface 106 may have a similar implementation as described in association with FIG. 6. The resynchronization circuit 100' may comprise other components (not shown). The number and/or types of components of the circuit 100' may be varied according to the design criteria of a particular implementation.

The adjustment circuit 100' may be configured to receive the signal CLK_IN from the clock tree 210. For example, the input driver 204 may receive the input clock signal CLK_IN and present the input clock signal CLK_IN to the clock tree 210. The clock tree 210 may present the input clock signal CLK_IN to various components of the adjustment circuit 210. Due to the different trace lengths between the clock tree 210 and the various components, the timing of the reception of the signal CLK_IN may be different for different components of the adjustment circuit 104'. The adjustment circuit 104' may be configured to generate the clock adjustment signals CADJ1-CADJN in response to the input clock signal CLK_IN.

The adjustment circuit 104' may comprise a block (or circuit) 300, a number of blocks (or circuits) 302a-302n and/or a block (or circuit) 304. The circuit 300 may implement a phase integrator. The circuits 302a-302n may implement phase adjuster circuits. For example, the phase adjuster circuits 302a-302n may be the adjustment components of the adjustment circuit 104'. The circuit 304 may implement a time-to-digital converter (TDC). The adjustment circuit 104' may comprise other components (not shown). The number and/or types of the components of the adjustment circuit 104' may be varied according to the design criteria of a particular implementation.

The phase adjuster circuits 302a-302n may be configured to receive the signal CLK_IN from the clock tree 210. The phase adjuster circuits 302a-302n may each receive a signal from the TDC 304. Each of the phase adjuster circuits 302a-302n may generate one of the clock adjustment signals CADJ1-CADJN. The phase adjuster circuits 302a-302n may present the clock adjustment signals to a respective one of the flip-flops 216a-216n of the output stages of the output interface 106. In an example, the adjustment circuit 104' may implement one of the phase adjuster circuits 302a-302n for each of the flip-flops 216a-216n (e.g., one of the phase adjust circuits 302a-302n corresponding to each bit transferred in the signal DATA_IN and/or DATA_OUT). Each of the phase adjuster circuits 302a-302n may present the one of the clock adjustment signals CADJ1-CADJN to the phase integrator 300. The phase adjuster circuits 302a-302n may be configured to sync the output.

The phase integrator 300 may be configured to provide a feedback integrator loop. The phase integrator 300 may force the synchronization of the outputs (e.g., the clock adjustment signals CADJ1-CADJN). The phase integrator 300 may provide a signal to the TDC 304. The TDC 304 may convert the time to a digital value for each of the phase adjuster circuits 302a-302n.

For implementations with more than 2 outputs, the adjustment circuit 104' may implement a parent-child (e.g., master-slave) structure. Implementing the master-slave structure may enable group synchronization. In some embodiments, the original input (e.g., the input clock signal CLK_IN) may be pulled into the phase integrator 300 to avoid the fly away. For example, when there is a large group of the outputs, the adjustment circuit 104' may be configured to group the outputs and use one of the phase adjusters 302a-302n to sync up one group to another group. The master-slave structure of the adjustment circuit 104' may clean up the variation/mismatch from distant locations in a large area, and assume the local variation/mismatch is relatively small.

The adjustment circuit 104 may be located near the output interface 106. Designing the apparatus 100 such that the adjustment circuit 104 is located near the output interface 106 may clean up jitter and/or skew that may be carried over the data path (e.g., the path from the input interface 102 to the output interface 106). The adjustment components 214a-214n may clean up the jitter and/or skew carried over the data path. In one example, to locate the adjustment circuit 104 near the output interface 106, the adjustment components 214a-214n (e.g., the PLL and/or DLL circuits) may be located directly adjacent to the output flip-flops 216a-216n. In some embodiments, no other components and/or buffers that introduce noise may be located between the adjustment components 214a-214n and the output flip-flops 216a-216n. The adjustment circuit 104 may not be limited to have a single buffer to drive the clock to the flip-flops 216a-216n and a single buffer that is under a clean power supply such as an internal LDO. Generally, the adjustment circuit 104 and/or the adjustment components 214a-214n may be implemented to prevent noise coupling and/or contamination at the stage of the data path between the adjustment circuit 104 and the output interface 106.

Although embodiments of the invention have been described in the context of a DDR4 application, the present invention is not limited to DDR4 applications, but may also be applied in other high data rate digital communication applications where different transmission line effects, cross-coupling effects, traveling wave distortions, phase changes, impedance mismatches and/or line imbalances may exist. The present invention addresses concerns related to high-speed communications, flexible clocking structures, specified command sets and lossy transmission lines. Future generations of DDR can be expected to provide increasing speed, more flexibility, additional commands and different propagation characteristics. The present invention may also be applicable to memory systems implemented in compliance with either existing (legacy) memory specifications or future (e.g., DDR5) memory specifications.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
an input interface comprising a plurality of input stages each configured to (i) receive (a) a data signal and (b) a clock signal through a first clock tree and (ii) present an intermediate signal;
an output interface comprising a plurality of output stages each configured to (i) receive said intermediate signal from one of said input stages, (ii) receive an adjusted clock signal and (iii) present an output signal; and
an adjustment circuit comprising a plurality of adjustment components each configured to (i) receive said clock signal through a second clock tree, (ii) receive a reference clock signal, and (iii) generate said adjusted clock signals presented to each of said output stages, wherein (a) said adjustment circuit is located near said output interface, and (b) each of said adjustment components is configured to resynchronize said clock signal for each respective bit transmitted from said input interface to said output interface to reduce a bit to bit delay caused by said clock tree.

2. The apparatus according to claim 1, wherein said apparatus is implemented in a register clock driver.

3. The apparatus according to claim 1, wherein said apparatus is implemented in a data buffer.

4. The apparatus according to claim 1, wherein said adjustment components are implemented as at least one of (a) phase-locked loop circuits and (b) delay-locked loop circuits.

5. The apparatus according to claim 4, wherein a fabrication size of said adjustment components enables one of said adjustment components to be placed next to each of said output stages of said output interface.

6. The apparatus according to claim 5, wherein said fabrication size is in a range of 28 nm to 65 nm.

7. The apparatus according to claim 4, wherein each of said adjustment components is further configured to receive said reference clock signal through a delay circuit.

8. The apparatus according to claim 4, wherein said adjustment components are designed without an embedded low-dropout regulator.

9. The apparatus according to claim 1, wherein said adjustment circuit is configured to adjust at least one of (a) jitter and (b) skew through at least one of a clock line and said clock tree.

10. The apparatus according to claim 1, wherein (i) said output stages are grouped into a plurality of output stage groups and (ii) said adjustment components are configured to synchronize one of said output stage groups with another of said output stage groups.

11. The apparatus according to claim 10, wherein said plurality of adjustment components are configured to adjust a variation between said output stage groups at distant locations from each other.

12. The apparatus according to claim 11, wherein said variation between said output stages within one of said output stage groups is negligible compared to said variation between said output stage groups at said distant locations from each other.

13. The apparatus according to claim 1, wherein said adjustment components comprise a phase adjuster.

14. The apparatus according to claim 13, wherein said adjustment circuit further comprises a feedback integrator loop configured to force a synchronization of said output interface.

15. The apparatus according to claim 13, wherein said adjustment circuit implements a master-slave structure for group synchronization when a number of said output stages is greater than two.

16. The apparatus according to claim 1, wherein said apparatus is configured to implement resynchronization of each data bit in a double data rate (DDR) memory system.

17. The apparatus according to claim 1, wherein said adjustment components are implemented using FinFET technology.

18. The apparatus according to claim 1, wherein each of said adjustment components comprises a phase locked loop configured to generate said adjusted clock signal for each bit based on a comparison between said clock signal and said reference clock signal.

\* \* \* \* \*